(12) United States Patent
Yoshimoto et al.

(10) Patent No.: US 9,049,771 B2
(45) Date of Patent: Jun. 2, 2015

(54) CHARGE-TRANSPORTING MATERIAL AND CHARGE-TRANSPORTING VARNISH

(75) Inventors: Takuji Yoshimoto, Funabashi (JP); Tomohisa Yamada, Funabashi (JP)

(73) Assignee: NISSAN CHEMICAL INDUSTRIES, LTD., Tokyo (JP)

(*) Notice: Subject to any disclaimer, the term of this patent is extended or adjusted under 35 U.S.C. 154(b) by 147 days.

(21) Appl. No.: 13/129,988

(22) PCT Filed: Nov. 18, 2009

(86) PCT No.: PCT/JP2009/069522
§ 371 (c)(1), (2), (4) Date: May 18, 2011

(87) PCT Pub. No.: WO2010/058776
PCT Pub. Date: May 27, 2010

(65) Prior Publication Data
US 2011/0220853 A1 Sep. 15, 2011

(30) Foreign Application Priority Data
Nov. 19, 2008 (JP) .................. 2008-295895

(51) Int. Cl.
*H01B 1/12* (2006.01)
*H05B 33/14* (2006.01)
(Continued)

(52) U.S. Cl.
CPC ............... *H05B 33/14* (2013.01); *C09K 11/06* (2013.01); *H01L 51/0036* (2013.01);
(Continued)

(58) Field of Classification Search
CPC ............ C09D 5/00; C09D 5/24; C09K 11/06; H01L 51/00; H01L 51/003; H05B 33/10; H05B 33/14

USPC ........ 252/519.3; 428/690; 430/56, 58; 264/41
See application file for complete search history.

(56) References Cited

U.S. PATENT DOCUMENTS 4,921,651 A * 5/1990 Polak et al. .............. 264/41
5,317,169 A 5/1994 Nakano et al.
(Continued)

FOREIGN PATENT DOCUMENTS

CA 1332643 C 10/1994
GB 1507777 * 4/1978 ............ H01G 9/02
(Continued)

OTHER PUBLICATIONS

Bharathan et al., "Polymer electroluminescent devices processed by inkjet printing: I. Polymer light-emitting logo," Applied Physics Letters, 1998, vol. 72, No. 21, pp. 2660-2662.
(Continued)

*Primary Examiner* — Khanh Tuan Nguyen
(74) *Attorney, Agent, or Firm* — Birch, Stewart, Kolasch & Birch, LLP (57) ABSTRACT

Disclosed is a charge-transporting material comprising a heteropoly acid compound such as phosphomolybdic acid as a charge-transporting substance. Also disclosed is a charge-transporting varnish comprising the charge-transporting material and an organic solvent, wherein the charge-transporting substance is dissolved in the organic solvent. It becomes possible to provide a charge-transporting material which comprises a substance having high solubility in an organic solvent, charge-transporting properties, and an ability to oxidize hole transport materials, and a charge-transporting varnish comprising the charge-transporting material.

7 Claims, 2 Drawing Sheets

[Chemical Formula 1]

(51) Int. Cl.
  *C09K 11/06* (2006.01)
  *H01L 51/00* (2006.01)
  *H01L 51/50* (2006.01)

(52) U.S. Cl.
  CPC ........ *H01L 51/0038* (2013.01); *H01L 51/0039* (2013.01); *H01L 51/004* (2013.01); *H01L 51/0059* (2013.01); *H01L 51/0068* (2013.01); *H01L 51/0073* (2013.01); *H01L 51/0085* (2013.01); *H01L 51/0089* (2013.01); *H01L 51/5048* (2013.01)

(56) References Cited

U.S. PATENT DOCUMENTS

| | | | |
|---|---|---|---|
| 5,726,457 | A | 3/1998 | Nakano et al. |
| 7,795,452 | B2 | 9/2010 | Yoshimoto et al. |
| 2003/0129451 | A1* | 7/2003 | Nukada et al. ............. 428/690 |
| 2006/0029870 | A1* | 2/2006 | Nukada et al. ............. 430/56 |
| 2006/0115652 | A1 | 6/2006 | Yoshimoto et al. |
| 2006/0292464 | A1* | 12/2006 | Yamada et al. ............. 430/56 |
| 2007/0131948 | A1 | 6/2007 | Seo et al. |
| 2007/0205400 | A1 | 9/2007 | Kato et al. |
| 2009/0239045 | A1 | 9/2009 | Kato et al. |

FOREIGN PATENT DOCUMENTS

| | | | | |
|---|---|---|---|---|
| JP | 1-252666 | A | 10/1989 | |
| JP | 02-016712 | * | 1/1990 | ............ H01G 9/02 |
| JP | 05-179188 | * | 7/1993 | ............ C09D 11/16 |
| JP | 3-273087 | A | 5/2002 | |
| JP | 2002-151272 | A | 5/2002 | |
| WO | WO 2004/043117 | A1 | 5/2004 | |
| WO | WO 2005/043962 | A1 | 5/2005 | |
| WO | WO 2005-107335 | A1 | 11/2005 | |
| WO | WO 2006/033472 | A1 | 3/2006 | |
| WO | WO 2007/041473 | A1 | 4/2007 | |
| WO | WO 2007/049631 | A1 | 5/2007 | |

OTHER PUBLICATIONS

Gustafsson et al., "Flexible light-emitting diodes made from soluble conducting polymers," Nature, 1992, vol. 357, pp. 477-479.

Lee et al., "The origin of the hole injection improvements at indium tin oxide/molybdenum trioxide/N,N'-bix(1-naphthyl)-N,N'-diphenyl-1, 1'-biphenyl-4,4'-diamine interfaces," Applied Physics Letters, 2008, vol. 93, 043308-1 thru 043308-3.

Matsushima et al., "Formation of Ohmic hole injection by inserting an ultrathin layer of molybdenum trioxide between indium tin oxide and organic hole-transporting layers," Applied Physics Letters, 2007, vol. 91, pp. 253504-1 thru 253504-3.

Tokito et al., "Metal oxides as a hole-injecting layer for an organic electroluminescent device," J. Phys. D.: Appl. Phys., 1996, vol. 29, pp. 2750-2753.

Van Slyke et al., "Organic electroluminscent devices with improved stability," Applied Physics Letters, 1996, vol. 69, No. 15, pp. 2160-2162.

Chen et al., "A novel composite ploymer electrolyte containing room-temperature ionic liquids and heteropolyacids for dye-sensitized solar cells", Electrochemistry Communications, vol. 9, No. 12, Oct. 22, 2007, pp. 2755-2759.

International Search Report dated Jan. 12, 2010 in International Application No. PCT/JP2009/069522.

"Proton-conducting Polymer Electrolyte Doped with Molybdophosphoric Acid and Ammonium Molybdophosphate", Zhao Xu, et al., Chemical Journal of Chinese Universities, vol. 24, No. 4, pp. 694-697 (2003).

Chinese Office Action and International Search Report mailed Aug. 5, 2013 for Chinese application No. 200980153032.2.

Japanese Office Action for Japanese Application No. 2010-539231, issued Jan. 21, 2014.

Taiwanese Office Action dated Oct. 13, 2014 for Taiwanese Application No. 098139315.

* cited by examiner

FIGURE 1

[Chemical Formula 1]

FIGURE 2

[Chemical Formula 2]

CHARGE-TRANSPORTING MATERIAL AND CHARGE-TRANSPORTING VARNISH

TECHNICAL FIELD

The present invention relates to a charge-transporting material and a charge-transporting varnish. More particularly, the invention relates to a charge-transporting material and a charge-transporting varnish which contain a heteropolyacid compound.

BACKGROUND ART

Conventionally, in relation to low-molecular organic electroluminescence (hereinafter referred to as OLED) devices, it has been reported that it is possible, by providing a copper phthalocyanine (CuPC) layer as a hole injection layer, to realize enhanced initial characteristics such as a lowered driving voltage, an enhanced luminous efficiency, etc. and, further, an enhanced life characteristic (Non-patent Document 1: Applied Physics Letters, USA, 1996, Vol. 69, pp. 2160-2162).

In addition, it has been reported that it is possible to lower the driving voltage by forming a thin film of a metallic oxide by vacuum evaporation and using the thin film as a hole injection layer (Non-patent Document 2: Journal of Physics D: Applied Physics, UK, 1996, Vol. 29, pp. 2750-2753).

On the other hand, in relation to organic electroluminescence devices using a polymeric luminous material (hereinafter referred to as PLED devices), it has been reported that an effect similar to that in the case of the OLED devices can be obtained by using a thin film comprised of a polyaniline material (Patent Document 1: JP-A 3-273087; Non-patent Document 3: Nature, UK, 1992, Vol. 357, pp. 477-479) or a polythiophene material (Non-patent Document 4: Applied Physics Letters, USA, 1998, Vol. 72, pp. 2660-2662) as a hole transport layer.

In recent years, charge-transporting varnishes have been found out which are each comprised of a uniform solution wherein a highly soluble low-molecular oligoaniline material or oligothiophene material is utilized and is completely dissolved in an organic solvent. Besides, it has been reported that when a hole injection layer obtained from such a varnish is inserted into an organic electroluminescence (hereinafter referred to as organic EL) device, a planarizing effect on an underlying substrate and excellent EL device characteristics can be obtained (Patent Document 2: JP-A 2002-151272; Patent Document 3: WO 2005/043962 pamphlet).

The low-molecular oligomer compounds are low in their own viscosity, so that when they are used with ordinary organic solvents, the process margin in the film forming operation is narrow. Therefore, the low-molecular oligomer compounds are disadvantageous in that it is difficult to form a film with high uniformity in the cases where various coating systems such as spin coating, ink jet coating, spray coating, etc. and/or various baking conditions are used.

In this point, use of various additional solvents makes it possible to regulate the viscosity, boiling point and/or vapor pressure, whereby it has become possible to obtain a formed film surface with high uniformity correspondingly to various coating systems (Patent Document 4: WO 2004/043117 pamphlet; Patent Document 5: WO 2005/107335 pamphlet).

However, at present, with full-scale mass production of organic EL devices being near at hand, there is a demand for further lowering in the driving voltage of the devices.

On the other hand, in recent years, hole injection layers using a metallic oxide have been reviewed. Specifically, it has been reported that a metallic oxide constituting the hole injection layer, upon contact with a hole transport layer, oxidizes the interface to thereby form a doped layer in the hole transport layer, whereby the driving voltage can be lowered (Non-patent Document 5: Applied Physics Letters, USA, 2007, Vol. 91, p. 253504; Non-patent Document 6: Applied Physics Letters, USA, 2008, Vol. 93, p. 043308). However, there is no example of a coating-type material which has an oxidizing property relative to a hole injection material, and, therefore, there is a request for development of a new material.

PRIOR-ART DOCUMENTS

Patent Documents

Patent Document 1: JP-A 3-273087
Patent Document 2: JP-A 2002-151272
Patent Document 3: WO 2005/043962 pamphlet
Patent Document 4: WO 2004/043117 pamphlet
Patent Document 5: WO 2005/107335 pamphlet

Non-Patent Documents

Non-patent Document 1: Applied Physics Letters, USA, 1996, Vol. 69, pp. 2160-2162
Non-patent Document 2: Journal of Physics D: Applied Physics, UK, 1996, Vol. 29, pp. 2750-2753
Non-patent Document 3: Nature, UK, 1992, Vol. 357, pp. 477-479
Non-patent Document 4: Applied Physics Letters, USA, 1998, Vol. 72, pp. 2660-2662
Non-patent Document 5: Applied Physics Letters, USA, 2007, Vol. 91, p. 253504
Non-patent Document 6: Applied Physics Letters, USA, 2008, Vol. 93, p. 043308

SUMMARY OF THE INVENTION

Problems to be Solved by the Invention

The present invention has been made in consideration of the above-mentioned circumstances. Accordingly, it is an object of the present invention to provide a charge-transporting material which contains a substance having a high solubility in organic solvents, a charge-transporting property and, further, an oxidizing property relative to a hole transport material, and a charge-transporting varnish which contains the charge-transporting material.

MEANS FOR SOLVING THE PROBLEMS

The present inventors made earnest investigations for attaining the above object. As a result of their investigations, the inventors found out that heteropolyacid compounds such as phosphomolybdic acid have a high solubility in organic solvents, a charge-transporting property and, further, an oxidizing property relative to a hole transport material. They also found out that when a charge-transporting thin film containing such a heteropolyacid compound is used as a hole injection layer in an OLED device, it is possible to lower the driving voltage and enhance the device life. Based on these findings, they have completed the present invention.

Figure 1:
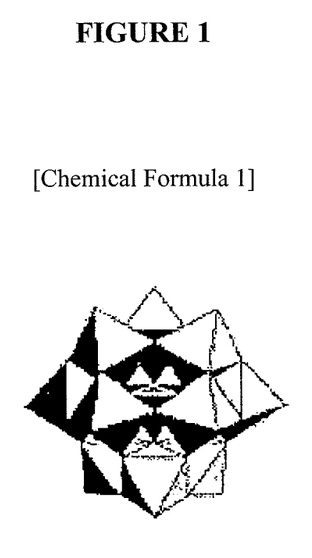
FIG. 1 depicts [Chemical Formula 1]
Figure 2:
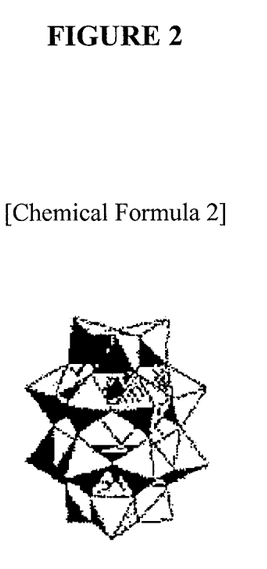
FIG. 2 depicts [Chemical Formula 2].

Incidentally, the heteropolyacid compounds such as phosphomolybdic acid have a Keggin type chemical structure representatively indicated by Chemical Formula 1 or a Dawson type chemical structure representatively indicated by Chemical Formula 2, that is, a structure in which a hetero atom is located at the center of the molecule.

With these peculiar chemical structures, the heteropolyacid compounds show dissolution characteristics and oxidation-reduction characteristics which are greatly different from those of isopolyacids composed only of oxyacids of metals or simple metallic oxides. The heteropolyacid compounds have conventionally been well known as coloring reagents for organic compounds and polymerization catalysts, but there have been few example of the use of the compounds themselves as charge-transporting substances.

The present inventors have found out that when a layer composed of an extremely thin film of such a heteropolyacid compound is formed in an organic EL device, the layer functions as an effective hole injection layer.

Accordingly, the present invention provides:
1. A charge-transporting material containing a heteropolyacid compound as a charge-transporting substance;
2. The charge-transporting material according to 1 above, wherein the heteropolyacid compound is phosphomolybdic acid;
3. A charge-transporting varnish containing the charge-transporting material according to 1 or 2 above and an organic solvent, wherein the heteropolyacid compound is uniformly dissolved in the organic solvent;
4. The charge-transporting varnish according to 3 above, wherein the organic solvent is a mixed solvent comprising at least one good solvent;
5. The charge-transporting varnish according to 3 or 4 above, containing a solvent having a viscosity at 25° C. of 10 to 200 mPa·s;
6. A charge-transporting thin film containing the charge-transporting material according to 1 or 2 above;
7. A charge-transporting thin film produced from the charge-transporting varnish according to any of 3 to 5 above;
8. An organic electroluminescence device comprising the charge-transporting thin film according to 6 or 7 above; and
9. The electroluminescence device according to 8 above, wherein the charge-transporting thin film constitutes a hole injection layer.

ADVANTAGEOUS EFFECT OF THE INVENTION

The heteropolyacid compound contained in the charge-transporting material and varnish according to the present invention has good solubility in organic solvents which are used for preparation of common charge-transporting varnishes. Particularly, once dissolved in a good solvent, the heteropolyacid compound shows excellent solubility also in various organic solvents such as low-surface-tension solvents. Therefore, a charge-transporting varnish based on a low-polarity organic solvent can be prepared by using a low-surface-tension solvent as part or the whole part of the solvent.

The carrier-transporting varnish based on a low-polarity organic solvent as just-mentioned not only can be applied by ink jet coaters for which solvent resistance matters but also can be used even in the cases wherein a structure for which solvent resistance matters, such as an insulating film and a partition wall, is present on a substrate. As a result, an amorphous solid-state thin film having high flatness can be produced without any problem.

Further, the heteropolyacid compound exhibits a good charge-transporting property by itself. Therefore, even when the heteropolyacid compound alone is used as a charge-transporting material without using any dopant substance or other charge-transporting substance, the thin film formed shows a good charge-transporting property. With this thin film used as a hole injection layer, the driving voltage of the organic EL device can be lowered, and a prolonged device life can be realized.

In addition, since the heteropolyacid compounds generally have a high refractive index, an enhanced light take-out efficiency can be expected to be obtained by effective optical design.

Besides, the thin film is applicable not only to organic EL devices but also to buffer layers or hole charge layers in solar cells, fuel-cell electrodes, capacitor electrode protective films, and anti-static films.

EMBODIMENT FOR CARRYING OUT THE INVENTION

Now, the present invention will be described more in detail below.

The charge-transporting material according to the present invention contains a heteropolyacid compound as a charge-transporting substance.

Here, the charge-transporting property is synonymous with electroconductivity, and means one of hole-transporting property, electron-transporting property, and hole- and electron-transporting property.

The above-mentioned heteropolyacid compound is a polyacid formed through condensation of an isopolyacid which is an oxyacid of vanadium (V), molybdenum (Mo), tungsten (W) or the like with an oxyacid of a different kind of element.

In this case, main examples of the oxyacid of a different kind of element include oxyacids of silicon (Si), phosphorus (P), arsenic (As) or the like.

Specific examples of the heteropolyacid compound include phosphomolybdic acid, silicomolybdic acid, phosphotungstic acid, silicotungstic acid, and phosphotungstomolybdic acid. In the present invention, from the viewpoints of high solubility in organic solvents and charge-transporting property of the heteropolyacid compound as well as lowering of driving voltage and enhancement of life when the heteropolyacid compound is used in an organic EL device, preferred of these examples are phosphomolybdic acid, phosphotungstic acid, and phosphotungstomolybdic acid, and particularly preferred is phosphomolybdic acid.

Incidentally, these heteropolyacid compounds are available as commercial products. For instance, phosphomolybdic acid (phosphomolybdic acid hydrate, or 12 molybdo(VI) phosphoric acid n-hydrate; rational formula: $H_3(PMO_{12}O_{40})\cdot nH_2O$) is available from Kanto Chemical Co., Inc., Wako Pure Chemical Industries, Ltd., Sigma-Aldrich Japan K.K., and the like.

The charge-transporting varnish according to the present invention contains the above-mentioned heteropolyacid compound (charge-transporting substance) and an organic solvent, wherein the heteropolyacid compound is uniformly dissolved in the organic solvent.

Incidentally, for enhancement of the flatness of a film upon coating or in a subsequent baking process, for enhancement of organic EL characteristics, and for enhancement of can-stability of the charge-transporting varnish, such as suppression of precipitation of solids, a solid material or solid materials according to the respective purpose(s) may be used together with the heteropolyacid compound, which is the charge-transporting material in the present invention.

As the organic solvent to be used in preparing the charge-transporting varnish, good solvents having a dissolving power for the heteropolyacid compound therein can be used.

Here, the term "good solvents" means those solvents which are capable of dissolving the heteropolyacid compound well.

Since the heteropolyacid compounds are high in solubility in high-polarity solvents, the good solvents are preferably high in polarity. Besides, since a solvent capable of being removed in the baking process after the coating is preferable, the boiling point of the good solvent at normal pressure is preferably 50 to 300° C. It should be noted here, however, that the good solvent is not particularly restricted insofar as the solvent is capable of completely dissolving the heteropolyacid compound to form a uniform solution and is capable of being removed in the film forming process.

Examples of such a good solvent include N,N-dimethylformamide, N,N-dimethylacetamide, N-methylpyrrolidone, 1,3-dimethyl-2-imidazolidinone, dimethyl sulfoxide, N-cyclohexyl-2-pyrrolidinone, cyclohexanol, ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol, hexylene glycol, o-cresol, m-cresol, p-cresol, acetone, methyl ethyl ketone, methyl isopropyl ketone, diethyl ketone, methyl isobutyl ketone, methyl n-butyl ketone, cyclohexanone, ethyl n-amyl ketone, methanol, ethanol, isopropanol, t-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-octanol, 1-methoxy-2-butanol, diacetone alcohol, furfuryl alcohol, tetrahydrofurfuryl alcohol, benzyl alcohol, propylene glycol monomethyl ether, ethylene glycol monomethyl ether, ethylene glycol monobutyl ether, propylene glycol monoethyl ether, ethylene glycol monoethyl ether, ethylene glycol monoisopropyl ether, propylene glycol monobutyl ether, dipropylene glycol monomethyl ether, diethylene glycol monomethyl ether, dipropylene glycol monoethyl ether, diethylene glycol monoethyl ether, and triethylene glygol dimethyl ether. These solvents may be used either singly or in mixture of two or more of them. The amount of the good solvent(s) to be used may be 5 to 100 wt % based on the total amount of the solvent(s) used for in the varnish.

Since the heteropolyacid used in the present invention is excellent in solubility in organic solvents, a high-viscosity solvent and/or a low-surface-tension solvent can be used together with the above-mentioned good solvent. The good solvent, the high-viscosity solvent and the low-surface-tension solvent may simultaneously have the properties of more than one of the different-termed solvents.

The high-viscosity solvent means a solvent which is capable of forming a uniform wet film by providing the varnish with a viscosity suitable for spraying or coating by various coating devices, is capable of causing volatilization of solvent while suppressing generation of ruggedness (roughness) or coagulation of a wet film at the time of baking, and is capable of leading to formation of a thin film having a high degree of film thickness uniformity.

Examples of the high-viscosity solvent include those having a viscosity of 10 to 200 mPa·s, particularly 50 to 150 mPa·s, at 25° C. Specifically, high-viscosity solvents having a boiling point of 50 to 300° C., particularly 150 to 250° C., at normal pressure are preferred. Examples of such a solvent include cyclohexanol, ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol, hexylene glycol, o-cresol, m-cresol, and p-cresol.

When these high-viscosity solvents are used, the amount thereof is preferably 10 to 90 wt %, more preferably 20 to 80 wt %, based on the total amount of the solvent(s) in the varnish.

Since the heteropolyacid compound used in the present invention is excellent in solubility in organic solvents, a low-surface-tension solvent may also be used together with the above-mentioned good solvent.

The low-surface-tension solvent means a solvent which is capable of enhancing the applicability of the varnish to a substrate through lowering of surface tension, imparting of volatility or the like, is capable of providing the varnish with physical properties suitable for spraying or coating by various coating devices, and is capable of lowering corrosiveness of the varnish to the coating device.

Examples of such a low-surface-tension solvent include aromatic hydrocarbons such as benzene, toluene, ethylbenzene, p-xylene, o-xylene, styrene, etc.; hydrocarbons such as n-pentane, n-hexane, n-heptane, n-octane, n-nonane, n-decane, etc.; esters such as ethyl acetate, isopropyl acetate, n-propyl acetate, i-butyl acetate, n-butyl acetate, n-amyl acetate, n-hexyl acetate, methyl caproate, 2-methylpentyl acetate, n-ethyl lactate, n-butyl lactate, etc; glycol esters or glycol ethers such as ethylene glycol dimethyl ether, ethylene glycol methyl ether acetate, propylene glycol monomethyl ether acetate, ethylene glycol ethyl ether acetate, diethylene glycol dimethyl ether, diethylene glycol diethyl ether, diethylene glycol monoethyl ether acetate, etc; and ethers or carboxylic acids such as diethyl ether, di-n-propyl ether, di-1-propyl ether, i-propyl ether, 1,4-dioxane, acetic acid, γ-butyrolactone, etc.

Where the good solvent and the low-surface-tension solvent are used together, the ratio of the amounts of them used is not particularly limited. An increase of the proportion of the low-surface-tension solvent used makes it possible to provide the varnish with new preferable physical properties such as an improved viscosity, a lowered surface tension, newly imparted volatility, enhanced applicability to substrate surfaces, enhanced coatability or sprayability, etc. In addition, the varnish thus obtained shows a lowered polarity, whereby it is made possible to use coating devices and substrates which have some problem as to solvent resistance; consequently, the application range of the varnish is widened.

Where the low-surface-tension solvent is used, a specific amount ratio of the good solvent to the low-surface-tension solvent is preferably in the range from about 9:1 to about 1:9, more preferably from about 1:1 to about 1:4, by weight.

Besides, where two or more solvents are used in mixture, the boiling point of the good solvent is desirably comparable to or higher than the boiling point(s) of the other solvent(s).

The method of preparing the charge-transporting varnish is not specifically restricted, and the varnish can be prepared by mixing the heteropolyacid compound and one or more solvents in an arbitrary order. Here, it is to be noted that the above-mentioned heteropolyacid compound has such a property that once the compound is dissolved in the good solvent, precipitation is less liable to occur even upon addition of a low-surface-tension solvent which is lower in polarity than the good solvent. Therefore, the charge-transporting varnish is preferably prepared by a method in which a solution obtained by dissolving the heteropolyacid compound in the good solvent is mixed with the low-surface-tension solvent.

Such a technique makes it possible to increase the proportion of the low-surface-tension solvent in the charge-transporting varnish.

The content of the heteropolyacid in the charge-transporting varnish is not particularly limited. Ordinarily, the content is about 0.01 to 50 wt %. From the viewpoint of formation of a thin film having a thickness of 0.1 to 200 nm, the content is preferably 0.1 to 10 wt %, more preferably 0.5 to 5 wt %.

The viscosity of the charge-transporting varnish is not particularly limited. From the viewpoint of formation of a thin film having a thickness of 0.1 to 200 nm with a high film thickness uniformity by a spin coating method, an ink jet method or a spray coating method, however, the viscosity is preferably 1 to 100 mPa·s at 25° C., more preferably 3 to 30 mPa·s, and further preferably 5 to 20 mPa·s.

A charge-transporting thin film can be formed on a substrate by applying the above-described charge-transporting varnish to the substrate and evaporating off the solvent.

The method of applying the varnish (coating with the varnish) is not specifically restricted. Examples of the method which can be used include a dipping method, a spin coating method, a transfer printing method, a roll coating method, a brush coating method, an ink jet method, a spraying method, and a slit coating method.

The method of evaporating off the solvent is not particularly limited. For instance, the solvent may be evaporated off by use of a hot plate or an oven and in an appropriate atmosphere, that is, in the atmospheric air, in an inert gas such as nitrogen, or in vacuum. As a result, a thin film having a uniform film surface can be obtained.

The baking temperature is not specifically restricted, insofar as the solvent can be evaporated off. Preferably, however, the baking is carried out at 40 to 250° C. In this case, the temperature may be changed in two or more levels, for the purpose of realizing a higher degree of uniform film forming property or causing the reaction to proceed on the substrate.

The thickness of the charge-transporting thin film is not particularly limited. Where the charge-transporting thin film is used as a charge injection layer in an organic EL device, the film thickness is preferably 0.1 to 200 nm, more preferably 0.5 to 50 nm, and further preferably 1.0 to 15 nm. Examples of the method for changing the film thickness include a method in which the solids concentration of the varnish is changed, and a method in which the amount of the solution on the substrate upon coating is changed.

Examples of the materials to be used and the fabricating method to be adopted in the case of fabricating an OLED device by use of the charge-transporting varnish according to the present invention include, but are not limited to, the following.

An electrode substrate to be used is preferably cleaned in advance by washing in a liquid such as a detergent, an alcohol, pure water, etc. For instance, an anode substrate is preferably subjected, immediately before use, to a surface treatment such as ozonization, an oxygen-plasma treatment, etc. It should be noted here, however, that no surface treatment is needed where the anode material contains an organic matter as a main ingredient.

Where the hole-transporting varnish is used for an OLED device, the following methods can be mentioned.

The anode substrate is coated with the hole-transporting varnish, and the evaporating-off and baking operation is conducted by the above-mentioned method, to form a hole-transporting thin film on the electrode, as a hole injection layer or a hole transport layer. The resulting assembly is introduced into a vacuum evaporation apparatus, and then a hole transport layer, a luminous layer, an electron transport layer, an electron injection layer, and an anode metal are sequentially layered by vacuum evaporation, to fabricate an OLED device. It is to be noted here that the device may be fabricated by omitting one or more of the just-mentioned layers, as required. A carrier block layer may be provided between arbitrary ones of the layers, for controlling the light-emitting region.

Examples of the anode material include transparent electrodes represented by indium tin oxide (ITO) and indium zinc oxide (IZO), of which preferred are those having been subjected to a planarizing treatment. Polythiophene derivatives and polyaniline derivatives which have a high charge-transporting property can also be used.

Examples of the material for forming the hole transport layer include triarylamines such as (triphenylamine) dimer derivatives (TPD), (α-naphthyl-diphenylamine) dimer (α-NPD), [(triphenylamine) dimer] spirodimer (Spiro-TAD), etc.; starburst amines such as 4,4',4"-tris[3-methylphenyl (phenyl)amino]triphenylamine (m-MTDATA), 4,4',4"-tris[1-naphthyl(phenyl)amino]-triphenylamine (1-TNATA), etc.; and oligothiophenes such as 5,5"-bis-{4-[bis(4-methylphenyl)amino]phenyl}-2,2':5',2"-terthiophene (BMA-3T), etc.

The hole transport materials which have a reducing property relative to the heteropolyacid compound used in the present invention is favorable, from the viewpoint of lowering of the driving voltage in the organic EL device characteristics. Particularly, triphenylamine, triarylamines or starburst amines are liable to be oxidized by the heteropolyacid compound used in the present invention, and, therefore, it is preferable for a layer containing one or more of these compounds to be used as a hole transport layer adjacent to a hole injection layer containing the heteropolyacid compound.

Examples of the material for forming the luminous layer include tris(8-quinolinolato)aluminum(III) ($Alq_3$), bis(8-quinolinolato)zinc(II) ($Znq_2$), bis(2-methyl-8-quinolinolato) (p-phenylphenolato)aluminum(III) (BAlq), and 4,4'-bis(2,2-diphenylvinyl)biphenyl (DPVBi). The luminous layer may be formed by co-evaporation of a electron transport material or a hole transport material with a luminous dopant.

Examples of the electron transport material include $Alq_3$, BAlq, DPVBi, (2-(4-biphenyl)-5-(4-t-butylphenyl)1,3,4-oxadiazole) (PBD), triazole derivatives (TAZ), bathocuproine (BCP), and silole derivatives.

Examples of the luminous dopant include quinacridone, rubrene, coumarin 540, 4-(dicyanomethylene)-2-methyl-6-(p-dimethylaminostyryl)-4H-pyran (DCM), tris(2-phenylpyridine)-iridium(III) ($Ir(ppy)_3$), and (1,10-phenanthroline)-tris (4,4,4-trifluoro-1-(2-thienyl)-butane-1,3-dionato)-europium (III) ($Eu(TTA)_3$-phen).

Examples of the material for forming the carrier block layer include PBD, TAZ, and BCP.

Examples of the material for forming the electron injection layer include lithium oxide ($Li_2O$), magnesium oxide (MgO), alumina ($Al_2O_3$), lithium fluoride (LiF), magnesium fluoride ($MgF_2$), strontium fluoride ($SrF_2$), Liq, Li(acac), lithium acetate, and lithium benzoate.

Examples of the cathode material include aluminum, magnesium-silver alloy, aluminum-lithium alloy, lithium, sodium, potassium, and cesium.

In addition, where the electron-transporting varnish is used for an OLED device, the following methods can be mentioned.

A cathode substrate is coated with the electron-transporting varnish to form an electron-transporting thin film. The resulting assembly is introduced into a vacuum evaporation apparatus, then an electron transport layer, a luminous layer, a hole transport layer, and a hole injection layer are formed by use of the same materials as above-mentioned, and a film of the anode material is formed by such a method as sputtering, to fabricate the OLED device.

The method for fabricating a PLED device by use of the charge-transporting varnish according to the present invention is not particularly limited, and the following methods can be mentioned.

Instead of the vacuum evaporation operations for forming the hole transport layer, the luminous layer, the electron transport layer, and the electron injection layer in fabrication of the OLED device as above-mentioned, a luminous charge-transporting polymer layer may be formed, whereby a PLED device including the electron-transporting thin film formed from the electron-transporting varnish according to the present invention can be fabricated.

Specifically, the anode substrate is coated with the charge-transporting varnish (hole-transporting varnish) according to the present invention, to form the hole-transporting thin film by the above-mentioned method, then the luminous charge-transporting polymer layer is formed thereon, and the anode electrode is further formed by vapor deposition, to obtain the PLED device. An interlayer may be provided between the hole-transporting thin film and the luminous polymer layer, for enhancing luminous efficiency and enhancing device life.

Or, the cathode substrate is coated with the charge-transporting varnish (electron-transporting varnish) according to the present invention, to form the electron-transporting thin film by the above-mentioned method, then the luminous charge-transporting polymer layer and the hole transport layer are sequentially formed thereon, and the anode electrode is further formed by such a method as sputtering, vapor deposition, spin coating, etc., to obtain the PLED device. An interlayer may be provided between the hole-transporting thin film and the luminous polymer layer, for enhancing luminous efficiency and enhancing device life.

As the cathode and anode materials to be used, the same materials as those in fabrication of the OLED device mentioned above can be used, and the same cleaning treatment and surface treatment as above-mentioned can be carried out.

As the method for forming the luminous charge-transporting polymer layer, there can be mentioned a method in which a solvent is added to the luminous charge-transporting polymer material, optionally having the luminous dopant added thereto, to dissolve or uniformly disperse the material in the solvent, then the resulting solution or dispersion is applied to the electrode substrate having been provided thereon with the hole injection layer, and the solvent is evaporated off to form the intended film.

Examples of the luminous charge-transporting polymer material include polyfluorene derivatives such as poly(9,9-dialkylfluorenes) (PDAF), etc.; polyphenylenevinylene derivatives such as poly(2-methoxy-5-(2'-ethylhexoxy)-1,4-phenylenevinylene) (MEH-PPV), etc.; polythiophene derivatives such as poly(3-alkylthiophenes) (PAT), etc.; and polyvinylcarbozole (PVCz).

Examples of the solvent include toluene, xylene, and chroloform, and examples of the dissolving or uniformly dispersing method include stirring, stirring under heating, and ultrasonic dispersing.

The coating method is not specifically restricted. Examples of the coating method include an ink jet method, a spraying method, a dipping method, a spin coating method, a slit coating method, a transfer printing method, a roll coating method, and a brush coating method. Incidentally, the coating is desirably carried out in an inert gas such as nitrogen, argon, etc.

Examples of the method for evaporating off the solvent include a method of heating by an oven or a hot plate, in an inert gas or in vacuum.

EXAMPLES

Now, the present invention will be described more specifically by showing Examples and Comparative Examples, but the invention is not to be limited to the following Examples. Incidentally, since the accurate amounts of water (moisture) in compounds were unknown, the solids concentrations described below are values obtained without subtracting the amounts of water from the weighings. In weighing, also, the purchased compounds were used as they were, without any pretreatment such as removal of water (moisture).

[1] Preparation of Charge-Transporting Varnish and Charge-Transporting Thin Film Example 1

To 0.30 g of phosphomolybdic acid ($H_3PMo_{12}O_{40}$·n-hydrate, made by Kanto Chemical Co., Inc.) was added 2.93 g of DMI (which is a good solvent) in a nitrogen atmosphere, thereby dissolving the acid. To this solution were added 1.47 g of propylene glycol and 4.40 g of cyclohexanol melted by heating to 40° C., and the resulting admixture was let cool to room temperature, to obtain a tan transparent solution.

The thus obtained solution was filtrated by use of a PTFE-made filter having a pore diameter of 0.2 μm, to obtain a tan transparent charge-transporting varnish (solids concentration: 3.3 wt %, viscosity: 11 mPa·s at 25° C.).

An ITO substrate having been subjected to ozone cleaning for 30 min was coated with the thus obtained varnish by a spin coating method, followed by baking on a hot plate at 220° C. in the atmospheric air for 30 min, to form a charge-transporting thin film. The thin film thus obtained was a uniform amorphous solid.

Example 2

To 0.30 g of phosphotungstic acid ($H_3PW_{12}O_{40}$·n-hydrate, made by Japan New Metals Co., Ltd.) was added 2.93 g of DMI (which is a good solvent) in a nitrogen atmosphere, thereby dissolving the acid. To this solution were added 1.47 g of propylene glycol and 4.40 g of cyclohexanol melted by heating to 40° C., and the resulting solution was let cool to room temperature, to obtain a tan transparent solution.

The thus obtained solution was filtrated by use of a PTFE-made filter having a pore diameter of 0.2 μm, to obtain a tan transparent charge-transporting varnish (solids concentration: 3.3 wt %, viscosity: 11 mPa·s at 25° C.).

An ITO substrate having been subjected to ozone cleaning for 30 min was coated with the thus obtained varnish by a spin coating method, followed by baking on a hot plate at 220° C. in the atmospheric air for 30 min, to form a charge-transporting thin film. The thin film thus obtained was a uniform amorphous solid.

Example 3

To 0.30 g of phosphotungstomolybdic acid ($H_3PW_6Mo_6O_{40}$·n-hydrate, made by Japan New Metals Co., Ltd.) was added 2.93 g of DMI (which is a good solvent) in a nitrogen atmosphere, thereby dissolving the acid. To this solution was added 1.47 g of propylene glycol and 4.40 g of cyclohexanol melted by heating to 40° C., and the resulting solution was let cool to room temperature, to obtain a tan transparent solution.

The thus obtained solution was filtrated by use of a PTFE-made filter having a pore diameter of 0.2 μm, to obtain a tan transparent charge-transporting varnish (solids concentration: 3.3 wt %, viscosity: 11 mPa·s at 25° C.).

An ITO substrate having been subjected to ozone cleaning for 30 min was coated with the thus obtained varnish by a spin coating method, followed by baking on a hot plate at 220° C. in the atmospheric air for 30 min, to form a charge-transporting thin film. The thin film thus obtained was a uniform amorphous solid.

Examples 4 to 7

For performing conductivity measurement, the following experiment was carried out. In order to avoid influences of solvents, DMAc was used as the same solvent in all runs of experiment. Incidentally, in conductivity measurement, it is necessary for the resistance of a sample thin film itself to be sufficiently greater than the resistance of a measuring device, and it is necessary to form a thick film. To meet these requirements, high-concentration varnishes were prepared.

To 1.00 g each of the above-mentioned phosphomolybdic acid ($H_3PMo_{12}O_{40}$·n-hydrate), the above-mentioned phosphotungstic acid ($H_3PW_6Mo_6O_{40}$·n-hydrate), phosphotungstic molybdic ($H_3PW_{12}O_{40}$·n-hydrate)acid and silicotungstic acid ($H_4SiW_{12}O_{40}$·n-hydrate, made by Japan New Metals Co., Ltd.) was added 5.67 g of DMAc in a nitrogen atmosphere, followed by stirring at room temperature, to obtain respective DMAc solutions (solids concentration: 15 wt %). All the solutions thus obtained were transparent solutions.

ITO substrates having been subjected to ozone cleaning for 30 min were coated respectively with the thus obtained varnishes by a spin coating method (1500 rpm, 20 sec), followed by baking on a hot plate at 220° C. in the atmospheric air for 30 min, to form charge-transporting thin films. The thin films thus obtained were uniform amorphous solids.

Comparative Example 1

An ITO substrate was coated with PEDOT/PSS (grade name: CH8000, made by H. C. Starck GmbH) by a spin coating method, followed by baking on a hot plate at 100° C. in the atmospheric air for 60 min, to form a charge-transporting thin film. The thin film thus obtained was a uniform amorphous solid.

Comparative Example 2

Attempts to prepare a charge-transporting varnish were carried out by using each of molybdenum oxide ($MoO_3$, made by Kanto Chemical Co., Inc.), molybdic acid ($H_2MoO_4$, made by Kanto Chemical Co., Inc.), ammonium molybdate (($NH_4)_6Mo_7O_{24}$, made by Kanto Chemical Co., Inc.), tungsten oxide ($WO_3$, made by Kanto Chemical Co., Inc.), vanadium oxide ($V_2O_5$, made by Kanto Chemical Co., Inc.), and manganese oxide ($MnO_2$, made by Kanto Chemical Co., Inc.). In each case, however, a uniform solution could not be obtained, because of insufficient solubility of these compounds in the above-mentioned good solvent.

Comparative Example 3

Vanadium oxide acetylacetonate ($VO(acac)_2$, made by Kanto Chemical Co., Inc.) was dissolved in chloroform, to obtain a 1 wt % chloroform solution.

Using this solution, a thin film was formed in the same manner as in Examples above. In this case, crystallization occurred at a film surface.

Comparative Example 4

Manganese acetate was dissolved in chloroform, to obtain a 1 wt % chloroform solution.

Using this solution, an attempt to form a thin film in the same manner as in Examples above was made. In this case, coagulation occurred at the time of film formation, so that a uniform thin film could not be obtained.

Physical property values of the thin films obtained in the above-mentioned Examples 1 to 7 and Comparative Example 1 are set forth in Table 1.

Incidentally, ionization potential was measured by use of a photoelectron spectrometer AC-2 made by Riken Keiki Co., Ltd. Film thickness was measured by use of a surfcorder ET-4000A made by Kosaka Laboratory Ltd.

Besides, in each of Examples 4 to 7 and Comparative Example 1, measurement of conductivity (at an electrode area of 0.2 mm² and a current density of 100 mA/cm²) was carried out using a sandwich type device (ITO/sample/Al (150 nm)) obtained by introducing each of the respectively obtained substrates into a vacuum evaporation apparatus and evaporating Al onto the substrate in a film thickness of 150 nm by use of an evaporation mask.

TABLE 1

|  |  | Film thickness [nm] | Ip [eV] | Conductivity [S/cm] | Voltage [V] |
|---|---|---|---|---|---|
| Example 1 | Phosphomolybdic acid | 30 | 5.8 | — | — |
| Example 2 | Phosphotungstic acid | 30 | 5.7 | — | — |
| Example 3 | Phosphotungstomolybdic acid | 30 | 5.8 | — | — |
| Example 4 | Phosphomolybdic acid | 70 | 5.8 | $1 \times 10^{-5}$ | <0.1 |
| Example 5 | Phosphotungstic acid | 50 | 5.7 | $2 \times 10^{-5}$ | <0.1 |
| Example 6 | Phosphotungstomolybdic acid | 50 | 5.8 | $2 \times 10^{-5}$ | <0.1 |
| Example 7 | Silicotungstic acid | 60 | 5.7 | $4 \times 10^{-5}$ | <0.1 |
| Comparative Example 1 | PEDOT/PSS | 60 | 5.6 | $2 \times 10^{-7}$ | 4.1 |

It is seen that, in Examples 1 to 3 in which a high-viscosity solvent was used, the viscosity of about 10 mPa·s promises favorable application to film formation by a spin coating method and an inject jet method, and the resulting film thickness can sufficiently meet the requirement of a film thickness value for a hole injection layer.

In addition, all the compounds according to the present invention were low in dependency of conductivity on electric field, showed a favorable charge-transporting property under a slight voltage, and exhibited a sufficiently high conductivity for use as a hole injection layer material (generally, a conductivity of not less than $10^{-7}$ S/cm is needed). In a material with a small barrier of field injection from electrode, it is desirable that the Ip value be approximate to or deeper than that of the hole transport material, namely, be approximate to or deeper than 5.4 eV. From this point of view, the Ip values of the compounds according to the present invention were all within the appropriate range.

In addition, the thin film obtained in Example 4 was put to measurement of refractive index (measuring apparatus: M-2000, made by J. A. Woollam Japan Co., Inc.) at wavelengths of 450 nm and 650 nm, to give refractive index values of 1.95 and 1.89. Thus, the phosphomolybdic acid thin film showed a high refractive index.

[2] Fabrication of OLED Device

Example 8

Using the same method as in Example 1 but changing the spinning rate, two kinds of hole-transporting thin films differing in thickness were respectively formed on ITO substrates. Each of the two substrates thus treated was introduced into a vacuum evaporation apparatus, and films of α-NPD, Alq$_3$, LiF, and Al were sequentially evaporated thereon, to fabricate an OLED device. The thicknesses of the evaporated films were 40 nm, 60 nm, 0.8 nm, and 150 nm, respectively. The evaporating operation for each of the films was carried out after a pressure of $2\times10^{-4}$ Pa or below was obtained. Evaporation rate was set at 0.1 to 0.2 nm/s for α-NPD and Alq$_a$, 0.01 to 0.02 nm/s for LiF, and 0.2 to 0.4 nm/s for Al. Moving operations between the evaporation operations were carried out in vacuum.

Comparative Example 5

An OLED device was fabricated by the same method as in Example 8, except that the hole-transporting thin film containing phosphomolybdic acid was not provided and that the thickness of the film of α-NPD as the hole transport layer was set to 70 nm.

Comparative Example 6

An OLED device was fabricated by the same method as in Example 8, except that a film of PEDOT/PSS (grade name: AI4083, made by H. C. Starck GmbH) was used as the hole injection layer.

Device characteristics obtained in Example 8 and Comparative Examples 5 and 6 are set forth in Table 2.

Incidentally, the characteristics of the OLED devices were measured by use of an organic EL luminous efficiency measuring apparatus (EL1003, made by Precise Gauges Co., Ltd.).

TABLE 2

| | Film thickness (nm) | Current density (mA/cm$^2$) | Voltage (V) | Luminance (cd/m$^2$) | Current efficiency (cd/A) | Half life of luminance*[1] (hr) |
|---|---|---|---|---|---|---|
| Example 8 | 30 | 10 | 7.8 | 315 | 3.15 | 150 |
| | | 50 | 10.6 | 1628 | 3.26 | |
| | 10 | 10 | 4.9 | 304 | 3.04 | 190 |
| | | 50 | 7.1 | 1534 | 3.07 | |
| Comparative Example 5 | — | 10 | 21.9 | 225 | 2.25 | <1 |
| | | 50 | 25.7 | 1153 | 2.31 | |
| Comparative Example 6*[2] | 40 | 10 | 4.8 | 264 | 2.64 | 150 |
| | | 50 | 6.0 | 1545 | 3.09 | |

*[1]Initial luminance 1500 cd/m$^2$
*[2]Luminous surface 2 mm × 2 mm (in others: 10 mm × 10 mm)
PEDOT/PSS: Measured for 2 mm square, since characteristics were inconstant for 10 mm square. Also, a film thickness of not less than 40 nm was necessary for attaining stable measurement.

As shown in Table 2, the device obtained in Example 8 has no problem as to stability of characteristics even in the case of 10 mm square and is comparable or higher in both initial characteristics (voltage and current efficiency) and life at a film thickness of 10 nm, owing to an extremely higher film thickness of the hole-transporting thin film containing phosphomolybdic acid, as compared with the thin film containing PEDOT/PSS.

Reference Example 1

At present, in most cases, a triarylamine-containing material such as a triphenylamine-containing material is used for a hole transport layer laminated adjacently to a hole injection layer. For evaluating the heteropolyacid compounds according to the present invention as to an oxidizing property relative to triarylamine-containing materials, the following experiment was conducted. Since the triphenylamine-containing compound is similar in physical properties to other triarylamine-containing compounds in use as hole transport layer material, the oxidizing properties of the heteropolyacid compounds relative to triarylamine-based hole transport layer materials in general can be evaluated by this experiment. To have an oxidizing property relative to a hole transport layer material means an ability to electrostatically generate carriers in part of the hole transport layer, whereby the driving voltage in an organic EL device can be lowered.

To 0.15 g of a triphenylamine dimer represented by the following formula and 0.30 g (two times the amount of the triphenylamine dimer by weight) of the above-mentioned phosphomolybdic acid, was added 7.05 g of DMI, and the resulting admixture was stirred under heating at 60° C. to effect dissolution, followed by letting the resulting solution to cool to room temperature, to obtain a uniform solution.

The thus obtained solution was filtrated by use of a PTFE-made filter having a pore diameter of 0.2 to obtain a tan transparent charge-transporting varnish (solids concentration: 6.0 wt %).

A quartz substrate having been subjected to ozone cleaning for 30 min was coated with the thus obtained varnish by a spin coating method, followed by baking on a hot plate at 150° C. in the atmospheric air for 30 min, to form a charge-transporting thin film. The thin film thus obtained was a uniform amorphous solid. When the thus obtained thin film was put to measurement of UV-VIS spectrum (measuring apparatus: UV-3100, made by Shimadzu Corp.), broad absorption peaks were generated at 550 nm and 730 nm.

These absorption peaks are absent in the spectrum of a thin film formed only of the triphenylamine dimer and in the spectrum of a thin film formed only of the phosphomolybdic acid. Therefore, these absorption peaks are considered to arise from a cation or dication of the triphenylamine dimer. Incidentally, many researches as to the production of cations of triarylamine-based materials have been conducted. As a result, it has been found that the cations show absorption peaks at 490 nm and 1330 nm, and that the absorption peaks are shifted to 610 nm and 810 nm, which are attributable to the dications, upon an increase in the amount of the oxidizing agent made to act on the triarylamine-based material.

From the above results, it is seen that the phosphomolybdic acid has an oxidizing property relative to the triphenylamine dimer.

This, in turn, suggests that a hole injection layer containing phosphomolybdic acid, when in contact with a hole transport layer formed of a hole transport material containing triphenylamine or other similar skeleton, may oxidize the contact interface so as to form a doped layer, thereby contributing to lowering of the driving voltage of the organic EL device.

[Chemical Formula 3]

Comparative Reference Example 1

A charge-transporting thin film was formed in the same manner as above, except that phosphomolybdic acid (made by Aldrich) was replaced by dinonylnaphthalenedisulfonic acid. When the thin film thus obtained was put to measurement of UV-VIS spectrum, no new absorption peaks other than the absorption peaks obtained in the cases of thin films formed respectively of singular compounds were generated. Thus, it is seen that dinonylnaphthalenedisulfonic acid does not have an oxidizing property relative to the triphenylamine dimer.

The invention claimed is:

1. A charge-transporting thin film produced from a charge-transporting varnish consisting of a charge-transporting material and an organic solvent,
    wherein the charge-transporting material contains a heteropolyacid compound as a charge-transporting substance, and
    the heteropolyacid compound is uniformly dissolved in the organic solvent,
    wherein the organic solvent contains one or more good solvent selected from the group consisting of N,N-dimethylformamide, N,N-dimethylacetamide, N-methylpyrrolidone, 1,3-dimethyl-2-imidazolidinone, dimethyl sulfoxide, N-cyclohexyl-2-pyrrolidinone, cyclohexanol, ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol, hexylene glycol, o-cresol, m-cresol, p-cresol, methyl isopropyl ketone, diethyl ketone, methyl isobutyl ketone, methyl n-butyl ketone, cyclohexanone, ethyl n-amyl ketone, isopropanol, t-butanol, allyl alcohol, 2-methyl-2-butanol, isobutanol, 2-methyl-1-butanol, 1-pentanol, 2-methyl-1-pentanol, 2-ethylhexanol, 1-octanol, 1-methoxy-2-butanol, diacetone alcohol, furfuryl alcohol, tetrahydrofurfuryl alcohol, benzyl alcohol, propylene glycol monomethyl ether, ethylene glycol monomethyl ether, ethylene glycol monobutyl ether, propylene glycol monoethyl ether, ethylene glycol monoethyl ether, ethylene glycol monoisopropyl ether, propylene glycol monobutyl ether, dipropylene glycol monomethyl ether, diethylene glycol monomethyl ether, dipropylene glycol monoethyl ether, diethylene glycol monoethyl ether, and triethylene glycol dimethyl ether, and
    wherein the organic solvent further contains a high-viscosity solvent having a viscosity at 25° C. of 10 to 200 mPa·s.

2. The charge-transporting thin film according to claim 1, wherein the heteropolyacid compound is phosphomolybdic acid.

3. The charge-transporting thin film according to claim 1, wherein the high-viscosity solvent is one or more solvent selected from the group consisting of cyclohexanol, ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol, hexylene glycol, o-cresol, m-cresol and p-cresol.

4. A layered product comprising a substrate and a charge-transporting thin film of claim 1 formed thereon.

5. The layered product according to claim 4, wherein the substrate is an electrode substrate.

6. The charge-transporting thin film of claim 1, wherein the thin film has a thickness of 0.1-200 nm.

7. The charge-transporting thin film of claim 1, wherein the charge-transporting thin film has a conductivity of not less than $10^{-7}$ S/cm.

* * * * *